Feb. 9, 1971 T. J. STOKES 3,562,805

BUS STRIPS AND CONTACTS

Filed Sept. 12, 1968 2 Sheets-Sheet 1

INVENTOR
THOMAS J. STOKES

BY Martin L. Faigus

ATTORNEY

BUS STRIPS AND CONTACTS

Filed Sept. 12, 1968 2 Sheets-Sheet 2

INVENTOR.
THOMAS J. STOKES
BY [signature]
ATTORNEY.

United States Patent Office 3,562,805

Patented Feb. 9, 1971

3,562,805
BUS STRIPS AND CONTACTS

Thomas J. Stokes, Philadelphia, Pa., assignor to Elco Corporation, Willow Grove, Pa., a corporation of Delaware Filed Sept. 12, 1968, Ser. No. 759,343
Int. Cl. H01r *11/22, 13/50, 25/00*
U.S. Cl. 339—176 14 Claims

ABSTRACT OF THE DISCLOSURE

An electrical contact for use in a card-edge connector has a nose portion with a bifurcated section comprising a pair of legs separated by a bifurcating slot. At least one chamfered surface is coined into the contact below the bifurcating slot, and a bus strip is provided with a similar chamfered surface for mating with the chamfered surface on the contact when the bus strip is inserted into the bifurcated slot. An alternative embodiment comprises a card-edge contact which has flat, parallel, uncoined surfaces below the bifurcating slot, and a bus strip which has a contact-receiving slot defined, in part, by inwardly facing projections having contact-engaging surfaces thereon. The bus strip is inserted into the bifurcating slot of the contact with the flat, parallel, uncoined surfaces of the contact positioned within the contact-receiving slot of the bus strip.

This invention relates to the mechanical and electrical interconnection of contacts with bus strips.

In electronic equipment groups of printed circuit boards carrying various circuit components are frequently interconnected to provide the desired electrical circuits. In such cases, each printed circuit board can be plugged into an electrical connector which is mounted on the front face of a metal plate. The metal plate serves to establish a ground plane for the electrical circuits on the printed circuit boards as well as to provide a mechanical support for the assembled printed circuit boards and connectors. Each connector is comprised of a casing of insulating material in which are mountd a plurality of contacts. Each contact has a tail section that passes through and extends beyond the rear face of the metal plate upon which the connector is mounted. The tail section of the contacts are usually square or rectangular in cross-section for permitting conventional automatic back panel wiring techniques, such as solderless wrapping or the like, to be used to establish the required electrical inter-connections and to permit power and signal inputs to be applied to the network as well as signal outputs to be taken therefrom.

In apparatus of the type described, each printed circuit board generally requires one or more power inputs, and for this purpose a voltage bus assembly is provided. A voltage bus assembly is comprised of a plurality of electrically interconnected contacts which mate with the conductive pads on the printed circuit boards requiring power at the same voltage level.

One type of voltage bus assembly is disclosed in the patent application of Herbert E. Ruehlemann, and Peter Slobodzian, Ser. No. 757,214 filed Aug. 26, 1968, and assigned to Elco Corporation. This voltage bus assembly is manufactured as a unitary structure by passing a continuous strip through a progressive die in the direction of the longitudinal axis of the strip. The nose portions of the various contacts are stamped from a portion of the strip on one side of the longitudinal axis, and the tail portions are stamped from a portion of the strip on the other side of the longitudinal axis. The center section of the strip provides the electrical and mechanical interconnection between the various nose and tail portions to thereby define the bus strip of the assembly. Tolerance variations in the manufacture of the bus assembly, and the insulating casings adapted to receive the bus assembly present misalignment problems in the assemblying operation. The unitary construction of the bus assembly permits only limited pivotal movement between the nose and tail portions of such assembly on the one hand, and the bus strip of the assembly on the other hand. The limited movement, accompanied by the fact that automatic assembly equipment presently is not available, makes the alignment and assembly of the bus assembly with the insulating casing a difficult, time consuming operation.

Another disadvantage of the bus assembly shown in Patent application Ser. No. 757,214, is its lack of versatility. Because of the unitary construction of the bus assembly, any defect or operational failure of a single nose portion or tail portion necessitates replacement of the complete unitary structure. The complete replacement of the bus assembly involves a waste of material, and is difficult to effect because of the large number of nose and tail portions which must be removed from and reassembled with the insulating casing.

A bus assembly comprised of individual contacts and a separate bus strip is known. This assembly is comprised of a card-edge contact having a nose portion comprised of a pair of legs separated by a bifurcating slot. Immediately below and adjacent to the termination of the slot, a clip extension extends transversely of the contact and is provided with a pair of opposed clamping fingers which will electrically and mechanically engage a flat, electrically conductive strip inserted into the bifurcating slot of the contact. The transversely extending clip extensions on the contacts limit the minimum spacing between adjacent contacts. In fact, such contacts were designed for use in bus assemblies wherein adjacent contacts are spaced on .250 inch centers or greater. This spacing is acceptable in environments wherein adjacent contacts are positioned in separate, adjacent, single read-out connectors; however, in dual read-out connectors wherein adjacent contacts are spaced as close as 0.100 inch, contacts with transverse clip extensions are not acceptable.

For purposes of definition in this application, a "single read-out connector" is defined as one having contacts positioned on only one side of a circuit board receiving slot for electrically engaging conductive tracks on only one side of a circuit board, and a "dual read-out connector" is defined as one having contacts on both sides of a circuit board receiving slot for electrically engaging conductive tracks on both sides of a circuit board.

To accommodate the lateral extensions, the contacts are stamped from strip material on approximately 0.5 inch centers, whereas contacts without lateral extensions are stamped on less than 0.25 inch centers. Thus, more waste is encountered in manufacturing contacts with lateral extensions than is the case in manufacturing contacts without such extensions.

The bus assemblies of the present invention comprise separate contacts and bus strips, thus eliminating the main assembly difficulties encountered in utilizing the unitary bus assembly disclosed in U.S. patent application Ser. No. 757,214. The contacts which are utilized in the bus assemblies of this invention do not have transversely extending bus strip engaging means, and therefore, the assembly of the present invention can be utilized in dual read-out connectors wherein contact spacings as small as 0.100 inch may be required. Also, the problem of excessive waste of material is alleviated through the elimination of transversely extending bus strip engaging means.

One bus assembly of this invention utilizes contacts which have a nose portion and a tail portion interconnected by a body portion. The body portion is utilized to firmly retain the electrical contact within the insulating casing of the electrical connector. The nose portion is defined by a bifurcated section comprising a pair of legs separated by a bifurcating slot. Each leg has a front surface with a curved portion thereof adapted to engage to a conductive track of a circuit board when the circuit board is positioned within a circuit board receiving slot in the insulating casing of an electrical connector.

The bifurcating slot extends downwardly from an upper surface of the nose section of the contact and terminates short of the body portion of said contact. An elongated slit is in alignment with the axis of the slot and is positioned in a section of the contact which is disposed between the body portion of the contact and the termination of the slot. Chamfered surfaces are provided on the contact adjacent the slit. An elongated bus strip is provided with contact-receiving slots extending through the lower surface thereof in a perpendicular direction to the direction of elongation of the strip, and chamfered surfaces are provided on the bus strip adjacent the contact-receiving slots for engaging the chamfered surfaces on the contacts when the bus strip is inserted into the bifurcating slots of such contacts. The mating of chamfered surfaces provides excellent electrical and mechanical interconnections between the contacts and bus strip.

In a second embodiment of this invention contacts are utilized which have the same general configuration as the contacts utilized in the first embodiment with the exception that the slit and chamfered surfaces are omitted. The region of the contact between the body portion and the termination of the bifurcating slot is comprised of a pair of flat, substantially parallel, uncoined surfaces. An elongated bus strip is provided with contact-receiving slots extending through the lower surface thereof in a perpendicular direction to the direction of elongation of said strip. The inner surfaces defining each slot are comprised of contact engaging surfaces which define a gap therebetween.

The contact engaging surfaces on the bus strip engage the flat surfaces on the contacts when the bus strip is inserted into the bifurcating slots of such contacts.

The more important features of this invention have thus been outlined rather broadly in order that the detailed description thereof which follows may be better understood, and in order that the contribution to the art may be better appreciated. There are, of course, additional features of the invention that will be described hereinafter and which will also form the subject of the claims appended hereto. Those skilled in the art will appreciate that the conception upon which this disclosure is based may readily be utilized as a basis for designing other structures for carrying out the several purposes of this invention. It is important, therefore, that the claims to be granted herein shall be of sufficient breadth to prevent the appropriation of this invention by those skilled in the art.

FIG. 1.—BIFURCATED CONTACT

Figures 1, 2, 4, 6:
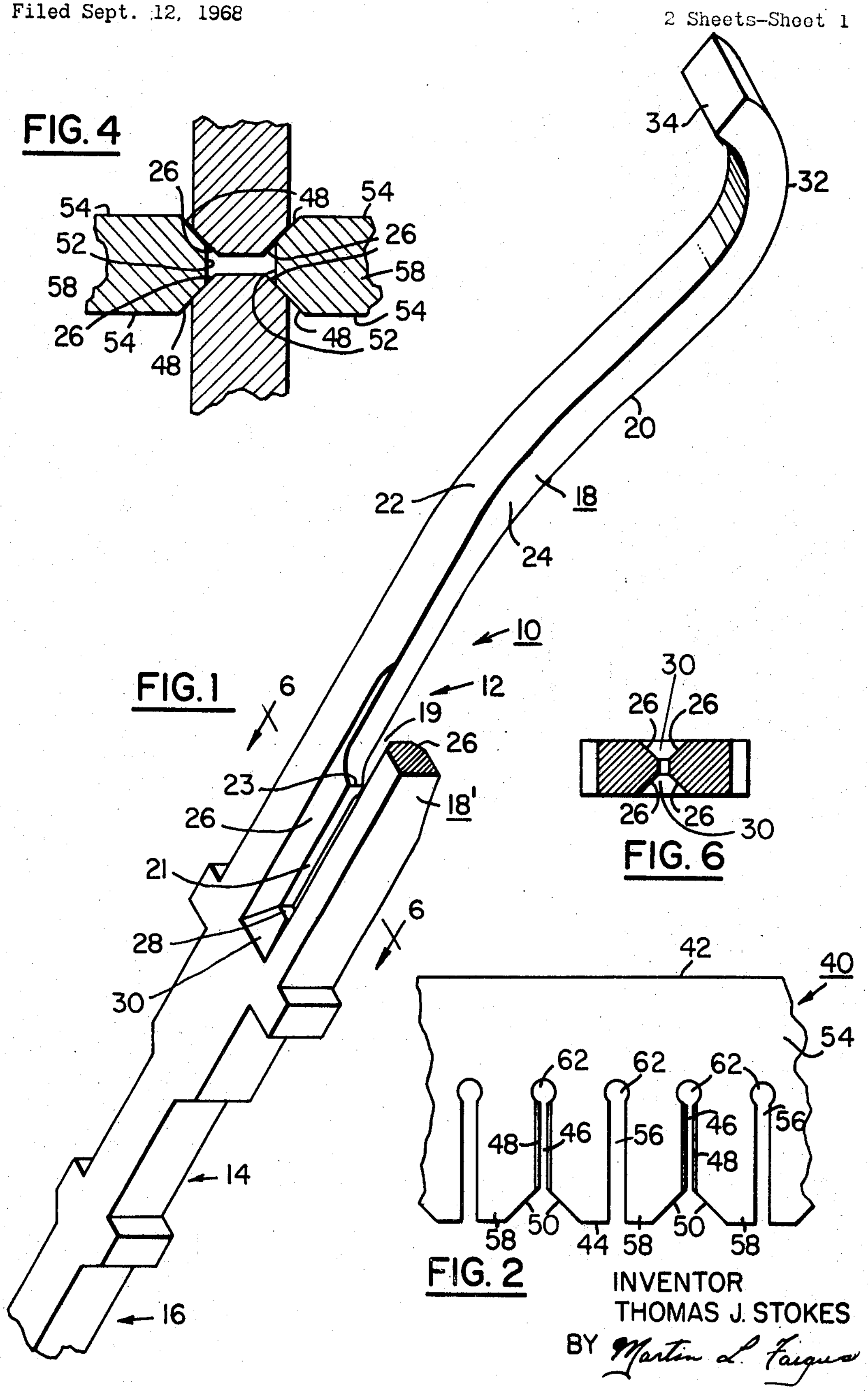
FIG. 1 is a perspective view of a novel contact of this invention.
FIG. 2 is a front view of one embodiment of the bus strip of this invention.
FIG. 4 is a sectional view taken through line 4—4 of FIG. 3.
FIG. 6 is a sectional view taken through line 6—6 of FIG. 1.

FIG. 1 shows a perspective view of the novel contact 10 of this invention. The contact 10 is comprised of a nose portion 12 and a tail portion 16 interconnected by a body portion 14. The nose portion 12 has a bifurcated section comprising a pair of identically shaped and oriented legs 18 and 18' separated by a bifurcating slot 19. The upper portion of leg 18' has been cut away in order to show the details of leg 18. The bifurcating slot 19 terminates at 23, and a slit 21 extends downwardly therefrom in alignment with the axis of said slot 19. The slit 21 terminates in a bridging portion 28 which is adjacent body portion 14 of the contact. Each leg 18 is provided with a rear surface 22, an inner surface 24, and a front surface 20. The front surface 20 has a curved circuit board-engaging portion 32 for engaging the conductive track of a printed circuit board. Regions of the contact adjacent slit 21 are coined to form four chamfered surfaces 26 (FIGS. 1, 4 and 6). The bridging portion 28 at the end of slit 21 is comprised of chamfered surfaces 30 (FIGS. 1 and 2). The slit 21 in the nose portion 12 of the contact need not be a through slit but can be formed as a blind slit.

Figure 3:
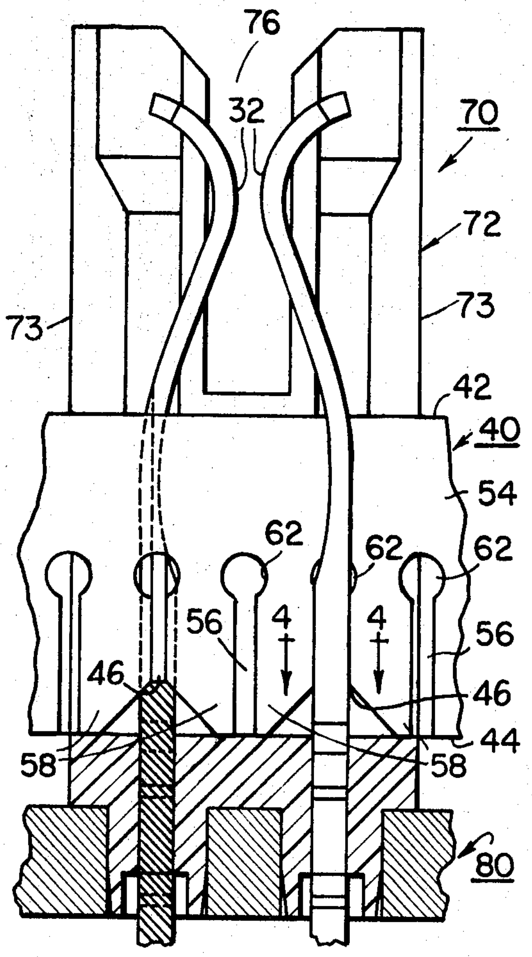
FIG. 3 is an assembly view of the contacts of this invention in an insulating casing; such contacts being interconnected by the bus strip of this invention, and a section of one of the contacts being removed to show details of construction.

The body portion 14 of the contact is utilized to retain the contact 10 within insulating housing 72 of the electrical connector 70 (FIG. 3). The tail portion 16 of the contact is comprised of a straight post portion which is suitable for automatic wire wrapping or other solderless type connections. It is understood that other suitable terminations can be provided on the contact of this invention.

FIG. 2.—BUS STRIP

FIG. 2 shows a bus strip 40 is disclosed which will mate with contact 18. Bus strip 40 is comprised of a member having elongated, substantially parallel, side surfaces 54 which are interconnected by an upper surface 42 and a lower surface 44. A plurality of contact-receiving slots 46 extend through the side surfaces 54 of the strip 40 from the lower surface 44 toward the upper surface 42 in a perpendicular direction to the direction of elongation of said side surfaces 54. The contact-receiving slots 46 are defined, in part, by inner surfaces 52 (FIG. 4) which face each other and are disposed in planes that are substantially perpendicular to the planes of the side surfaces 54. The inner surfaces 52 and side surfaces 54 are interconnected by chamfered surfaces 48 which are adapted to mate with the chamfered surfaces 26 of contact 10. The inner surfaces 52 and chamfered surfaces 48 terminate short of lower surface 44 of the bus strip 40, and inclined surfaces 50 interconnect said chamfered surfaces and inner surfaces with lower surface 40. A relief slot 56 is interposed between each pair of contact-receiving slots 46. These relief slots extend through the side surfaces 54 of the bus strip 40 and are parallel to contact-receiving slots 46. Each relief slot 56 and its adjacent contact-receiving slot 46 defines a leg 58 therebetween which is resiliently deflectable in the plane of the bus strip 40 to provide a resilient interconnection between contact 10 and bus strip 40. Relief openings 62 are provided at the end of relief slots 56 remote from lower surface 44 to further contribute to the resiliency of legs 58. Since legs 58 are resiliently deflectable, the bus strip can be assembled easily with contacts which are mounted within insulating casings despite some slight misalignment of parts due to tolerance variations.

FIG. 4

FIG. 4 shows the manner in which the chamfered surfaces 48 of the bus strip 40 mate with chamfered surfaces 26 of the contact 10. The bus strip 40 is inserted into the bifurcating slot 19 of the contacts 10 with each contact-receiving slot 46 aligned with a respective slit 21 in each of the contacts. Bus strip 40 is then pressed downwardly to cause chamfered surfaces 48 on the bus strip to frictionally engage with, and slide against chamfered surfaces 26 of the contact. The sliding, frictional engagement between the four chamfered surfaces on each contact 10 and the corresponding surfaces on the bus strip 40 will remove any oxide on such mating surfaces to insure that electrical continuity exists.

In the undeflected condition of legs 58, the distance between facing inner surfaces 52 defining each contact-receiving slot 46 of bus strip 40 is smaller than the transverse dimension of the contact in the region of the slit 21 and chamfered surfaces 26 of contact 10. This arrangement causes adjacent legs 58 to be resiliently urged apart upon assembly of the bus strip 40 with contact 10 to insure that excellent mechanical and electrical continuity is maintained.

In assembled condition, clearance is provided between inclined surfaces 50 on bus strip 40, and the chamfered surfaces 30 on each contact 10 to prevent adjacent legs 58 from being forced apart due to the sliding interaction between said surfaces, which would thereby destroy the electrical and mechanical continuity between the chamfered surfaces of bus strip 40 and contact 10.

FIG. 3

FIG. 3 shows an electrical connector 70 which has a pair of contacts 10 therein which are interconnected by bus strip 40. The electrical connector 70 is comprised of insulating housing 72 and a plurality of pairs of contacts 10 (only one pair being shown in FIG. 3); the insulating housing being mounted to a metal plate 80 through any suitable connection means such as hubs on said insulating casing. Slots are provided through side walls 73 of the insulator to receive the bus strip therein. The circuit board (not shown) may have circuitry on both sides thereof. Electrical terminations to both sides of the circuit board are effected by board-engaging portions 32 of contacts 10. The bus strip for electrically interconnecting the pair of contacts 10 shown in FIG. 3 is provided with contact-receiving slots 46 which are spaced on the same distance across the strip as the spacing between such contacts 10. The contact spacing between each pair of contacts 10 in a dual-read-out connector is usually between 0.100 inch and 0.200 inch.

It is understood that usually a plurality of electrical connectors are mounted side-by-side on metal plate 80 with side walls 73 adjacent to one another, and the slots in said side walls being aligned to receive the bus strip 40 in a plane which is substantially perpendicular to the circuit board receiving slots 76 to thereby electrically interconnect contacts within each electrical connector which require power at the same voltage level.

FIG. 5

Figure 5:
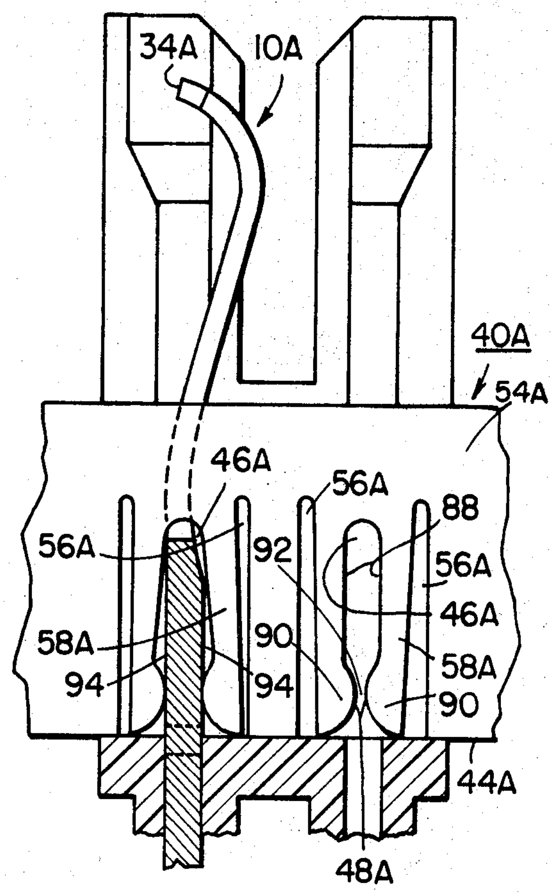
FIG. 5 is an assembly view, similar to FIG. 3, of a second embodiment of this invention.

Referring now to FIG. 5, a second embodiment of the invention is shown. A contact 10A has a nose portion comprised of a pair of legs separated by a bifurcating slot as described with respect to the contact disclosed in FIG. 1. The region of the nose portion of contact 10A which is between the body portion of said contact and the termination of the bifurcating slot is comprised of a pair of flat, substantially parallel, surfaces 94 which are neither slit nor coined.

The bus strip 40A, which is utilized to interconnect contacts 10A, is comprised of elongated, substantially parallel, side surfaces 54A which are interconnected by a lower surface 44A. A plurality of contact-receiving slots 46A are spaced along the bus strip in the direction of elongation of said bus strip on the same spacing as the spacing between the contacts to be interconnected. Each contact-receiving slot 46A extends through the said surfaces 54A in a perpendicular direction to the direction of elongation of said bus strip. Each slot is defined, in part, by inner flat surfaces 88, which face each other, and which terminate short of the lower surface 44A. Inwardly facing projections 90 have contact-engaging surfaces 48A thereon defining a gap therebetween; the distance between the contact-engaging surfaces 48A being less than the transverse dimension between the flat, parallel surfaces 94 of contact 10A. The embodiment of the bus strip shown in FIG. 5 has a pair of relief slots 56A positioned between each pair of contact-receiving slots 46A; one of said relief slots 56A forming a leg 58A with its adjacent contact-receiving slot 46A, and the other relief slot 56A forming a leg 58A with its adjacent contact-receiving slot 46. It is understood that the arrangement of relief slots as shown in bus strip 40A can also be utilized with the bus strip 40, and that the arrangement of relief slots 56 shown in bus strip 40 can also be utilized in the bus strip 40A. It is further understood that the bus strips of this invention have the versatility of being utilizable with either dual read-out connectors, single read-out connectors, or a combination of both types of connectors.

The bus strip 40A is connected to contacts 10A in the same manner as bus strip 40 is connected to contact 10. Since the gap between contact-engaging surfaces 48A on the bus strip is less than the transverse dimension between the flat, substantially parallel surfaces 94 of the contact 10A, adjacent legs 58A will be biased apart by their engagement with the flat surfaces 94 to thereby provide a resilient electrical and mechanical interconnection with the contact.

The voltage bus assemblies disclosed in this application are assembled as hereinafter described. The loose contacts 10 or 10A are first assembled into the insulating housings 72 of the electrical connectors 70. The insulating housings 72 loaded with contacts 10 or 10A are then assembled on metal plate 80. Both the loading of the contacts within insulating housings 72, and the assembling of the electrical connectors 70 on the metal plate are accomplished by well known time proven techniques and automatic equipment. After the electrical connectors are mounted on the metal plate, the bus strips 40 or 40A are inserted into the slots formed in the side walls 73 of the insulating housings 72 through the bifurcating slots of the contacts which are to be electrically interconnected, until contact-receiving slots 46 or 46A of the bus strips 40, 40A, respectively, are driectly aligned with the bifurcating slots of the contacts. The bus strips 40 or 40A are then pushed downwardly toward the tail portion of the contacts to cause the legs 58 or 58A to electrically and mechanically engage with the contacts 10, 10A, respectively.

I claim:

1. In combination, a contact for use in a card-edge connector and a bus strip for interconnecting electrically a plurality of said contacts, said contact comprising an elongated member having a nose portion, a tail portion, and a body portion interconnecting said nose and tail portions.

said nose portion having a bifurcated front section comprising a pair of legs separated by a bifurcating slot, each of said legs having a front surface which has a curved portion for engaging a conductive track on a printed circuit board, said nose portion also having a rear section, interconnecting said curved portions of said legs and said body portion, to which electrical and mechanical connection with said bus strip can be made, said rear section comprising a pair of chamfered surfaces.

said bus strip comprising a member having elongated, substantially parallel side surfaces and a plurality of contact-engaging surface means for electrically and mechanically connecting said strip to said rear section of said contact, each of said contact-engaging surface means comprising a pair of chamfered surfaces which are arranged to mate with said chamfered surfaces of said contact, said bus strip being positioned within said bifurcating slot of said contact such that said pair of chamfered surfaces of said bus strip mate, electrically and mechanically, with said pair of chamfered surfaces of said contact.

2. The combination of claim 1 wherein said bus strip has a lower surface interconnecting said side surfaces and a contact-receiving slot extending through said side surfaces from said lower surface of said strip in a direction perpendicular to the direction of elongation of said side surfaces, said slot being defined, at least in part, by inner surfaces which face each other and which are disposed in planes that are substantially perpendicular to the plane of said side surfaces, said inner surfaces and said side surfaces being interconnected by said chamfered surfaces which are arranged to mate with the chamfered surfaces constituting the connection means on said contact.

3. The contact and bus strip of calim 1 further including a second contact similar to said first-named contact, said bus strip also being positioned within the bifurcating slot of said second contact such that another pair of contact-engaging surfaces of said bus strip mate, electrically and mechanically, with the pair of chamfered surfaces of said second contact.

4. The contact and bus strip of claim 3 further including an insulating housing having an elongated slot in one side thereof for receiving a printed circuit board, said contacts being mounted in said housing such that (1) the tail portion of each contact protrudes from the side of said housing opposite said one side thereof, and (2) said nose portion of each contact is positioned in said slot such that the curved portions of said legs engage said printed circuit board when it is inserted into said slot.

5. The contact and bus strip of claim 4 wherein the spacing between said contacts is approximately 0.100 to 0.200 inch.

6. The contacts and bus strip of claim 1 further including an insulating housing having an elongated slot in one side thereof for receiving a printed circuit board, said contact being mounted in said housing such that (1) the tail portion of said contact protrudes from the side of said housing opposite said one side thereof, and (2) said nose portion is positioned in said slot such that said curved portion of said front surface thereof engages said printed circuit board when it is inserted into said slot.

7. A bus strip for electrically connecting a plurality of electrical contacts of the type which include a plurality of chamfered surfaces, comprising:

a member having a pair of elongated, substantially parallel, planar side surfaces and a lower surface interconnecting said side surfaces;

a plurality of spaced contact-receiving slots extending through said side surfaces from the lower surface of said strip in a direction perpendicular to the direction of elongation of said side surfaces, each slot being defined, in part, by inner surfaces which face each other and which are disposed in planes that are substantially perpendicular to the plane of said side surfaces, said inner surfaces and said side surfaces being interconnected by chamfered contact-engaging surfaces which are arranged to mate with said chamfered contact surfaces of said contact.

8. The bus strip of claim 7 wherein said bus strip also includes a pair of relief slots spaced on opposite sides of each contact-receiving slot, each relief slot and each contact-receiving slot defining a leg therebetween which is deflectable in the plane of said bus strip to provide a resilient interconnection between said contact and said bus strip.

9. In an electrical contact of the type for use in a card-edge connector, comprising:

an elongated member having a nose portion, a tail portion, and a body portion interconnecting said nose and tail portions, said nose portion having a bifurcated section comprising a pair of legs separated by a bifurcating slot, each of said legs having a front surface near the end thereof which has a curved portion for engaging a track on a printed circuit board, said contact also including bus member engaging means comprising a pair of surfaces for engaging, electrically and mechanically, a respective pair of surfaces of a bus member for interconnecting a plurality of said contacts when said bus member is inserted into said bifurcating slot, the improvement wherein said bus member engaging means comprises a pair of chamfered surfaces formed on said pair of legs, respectively, remote from the ends thereof and adjacent the body portion of said contact, for engaging a similar pair of chamfered surfaces on a slot formed in said bus member.

10. The contact of claim 9 wherein said contact consists solely of said elongated member having said nose, body, and tail portions.

11. In combination, a contact for use in a card edge connector and a bus strip for interconnecting electrically a plurality of said contacts, said contact comprising an elongated member having a nose portion, a tail portion, and a body portion interconnecting said nose and tail portions, said nose portion having a bifurcated front section comprising a pair of legs separated by a bifurcating slot, each of said legs having a front surface which has a curved portion for engaging a conductive track on a printed circuit board, said nose portion also having a rear section, interconnecting said front section and said body portion, to which electrical and mechanical connection with said bus strip can be made, said bus strip comprising a member having elongated, substantially parallel side surfaces and at least one contact-receiving slot extending through said side surfaces from a lower surface of said strip in a direction perpendicular to the direction of elongation of said side surfaces, said slot being defined by inner surfaces which, at least in part, face each other and which interconnect said side surfaces, said inner surfaces having contact-engaging portions designed to mate with a pair of surfaces of said rear section of said contact, said bus strip being positioned within said bifurcating slot of said contact such that said contact-engaging portions of said inner surfaces of said slot mate, electrically and mechanically, with said pair of surfaces of said rear section of said contact.

12. The contact and bus strip of claim 11 wherein said rear section of said contact comprises a pair of chamfered surfaces and said contact-engaging portions of said inner surfaces of said slot also comprise a pair of chamfered surfaces designed to mate with said pair of chamfered surfaces of said contact.

13. The contact and bus strip of claim 11 wherein said rear section of said contact comprises a pair of planar, parallel surfaces and said contact, engaging portions of said inner surfaces of said slot comprise a pair of curved, convex surfaces which are perpendicular to said side surfaces, have a gap therebetween having a dimension less than the dimension between said pair of planar, parallel surfaces of said contact, and which are designed to mate, electrically and mechanically, with said pair of planar, parallel surfaces of said contact.

14. The contact and bus strip of claim 12 wherein said bus strip also includes a pair of relief slots spaced on opposite sides of said contact-receiving slot, each relief slot and said contact-receiving slot defining a leg therebetween which is deflectable in the plane of said bus strip to provide a resilient interconnection between said contact and said bus strip.

References Cited

UNITED STATES PATENTS

| | | | |
|---|---|---|---|
| 2,554,876 | 5/1951 | Olson | 173—363 |
| 2,828,474 | 3/1958 | Fox | 339—185 |
| 3,112,147 | 11/1963 | Pferd et al. | 339—97 |
| 3,431,545 | 3/1969 | Kirby | 339—258 |

MARVIN A. CHAMPION, Primary Examiner

L. J. STAAB, Assistant Examiner

U.S. Cl. X.R.

339—47, 258